(12) United States Patent
Stacey

(10) Patent No.: US 9,177,885 B2
(45) Date of Patent: Nov. 3, 2015

(54) CHIP MOUNTING

(75) Inventor: Simon Jonathan Stacey, Suffolk (GB)

(73) Assignee: Cambridge Silicon Radio Limited, Cambridge (GB)

( * ) Notice: Subject to any disclaimer, the term of this patent is extended or adjusted under 35 U.S.C. 154(b) by 1040 days.

(21) Appl. No.: 12/518,262

(22) PCT Filed: Nov. 26, 2007

(86) PCT No.: PCT/GB2007/004500
§ 371 (c)(1),
(2), (4) Date: Aug. 27, 2009

(87) PCT Pub. No.: WO2008/071905
PCT Pub. Date: Jun. 19, 2008

(65) Prior Publication Data
US 2010/0013093 A1    Jan. 21, 2010

(30) Foreign Application Priority Data

Dec. 13, 2006  (GB) .................................. 0624888.4

(51) Int. Cl.
*H01L 23/32*  (2006.01)
*H01L 23/31*  (2006.01)
*H01L 23/28*  (2006.01)
(Continued)

(52) U.S. Cl.
CPC ........ *H01L 23/3114* (2013.01); *H01L 23/3192* (2013.01); *H01L 24/05* (2013.01); *H01L 24/13* (2013.01); *H01L 23/28* (2013.01); *H01L 23/29* (2013.01); *H01L 23/532* (2013.01); *H01L 24/10* (2013.01); *H01L 2224/024* (2013.01); *H01L 2224/0401* (2013.01); *H01L 2224/05572* (2013.01); *H01L 2224/13111* (2013.01); *H01L 2224/16* (2013.01); *H01L 2924/0002* (2013.01); *H01L 2924/00014* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01014* (2013.01); *H01L 2924/01015* (2013.01); *H01L 2924/01022* (2013.01); *H01L 2924/01029* (2013.01); *H01L 2924/01047* (2013.01); *H01L 2924/10253* (2013.01); *H01L 2924/14* (2013.01)

(58) Field of Classification Search
CPC ....... H01L 23/28; H01L 23/29; H01L 23/532; H01L 2224/024
See application file for complete search history.

(56) References Cited

U.S. PATENT DOCUMENTS 6,277,669 B1   8/2001   Kung et al.
6,323,542 B1  11/2001   Hashimoto
(Continued)

FOREIGN PATENT DOCUMENTS

EP    1677585 A    7/2006
JP    10-321750 A  12/1998
(Continued)

*Primary Examiner* — Evan Pert
*Assistant Examiner* — Leslie Pilar Cruz
(74) *Attorney, Agent, or Firm* — Vorys, Sater, Seymour and Pease LLP; Vincent M DeLuca

(57) ABSTRACT

A device comprising a chip including a substrate defining one or more electronic devices and a printed circuit board electrically connected to the chip via one or more solder elements sandwiched between the chip and the printed circuit board, and the solder elements, said buffer layers having a Young's Modulus of 2.5GPa or less.

17 Claims, 4 Drawing Sheets

(51) Int. Cl.
  *H01L 23/532* (2006.01)
  *H01L 23/29* (2006.01)
  *H01L 23/00* (2006.01)

(56) References Cited

U.S. PATENT DOCUMENTS

| | | | |
|---|---|---|---|
| 6,462,426 B1 | 10/2002 | Kelkar et al. | |
| 6,475,896 B1 | 11/2002 | Hashimoto | |
| 2002/0027269 A1 | 3/2002 | Hashimoto | |
| 2002/0034872 A1 | 3/2002 | Kazama et al. | |
| 2002/0079575 A1* | 6/2002 | Hozoji et al. | 257/734 |
| 2002/0084528 A1 | 7/2002 | Kim et al. | |
| 2002/0093107 A1 | 7/2002 | Wu et al. | |
| 2002/0100986 A1* | 8/2002 | Soga et al. | 257/779 |
| 2003/0049193 A1 | 3/2003 | Satsu et al. | |
| 2003/0214051 A1 | 11/2003 | Dent | |
| 2003/0219588 A1 | 11/2003 | Ogawa et al. | |
| 2004/0043538 A1 | 3/2004 | Lo et al. | |
| 2004/0089470 A1* | 5/2004 | Shimoto et al. | 174/250 |
| 2005/0258539 A1 | 11/2005 | Minda | |
| 2006/0006480 A1* | 1/2006 | Shinozaki et al. | 257/401 |
| 2006/0220244 A1* | 10/2006 | Lu et al. | 257/738 |

FOREIGN PATENT DOCUMENTS

| | | |
|---|---|---|
| JP | 2000-216290 A | 8/2000 |
| JP | 2000-323628 A | 11/2000 |
| JP | 2001-257282 A | 9/2001 |
| JP | 2004-214561 A | 7/2004 |
| JP | 2005-39260 A | 2/2005 |
| JP | 2005-191604 A | 7/2005 |
| JP | 2005-317685 A | 11/2005 |
| KR | 2006-0007881 A | 2/2006 |
| WO | 2006/057360 A1 | 6/2006 |

* cited by examiner

WLCSP Drop Test Performance

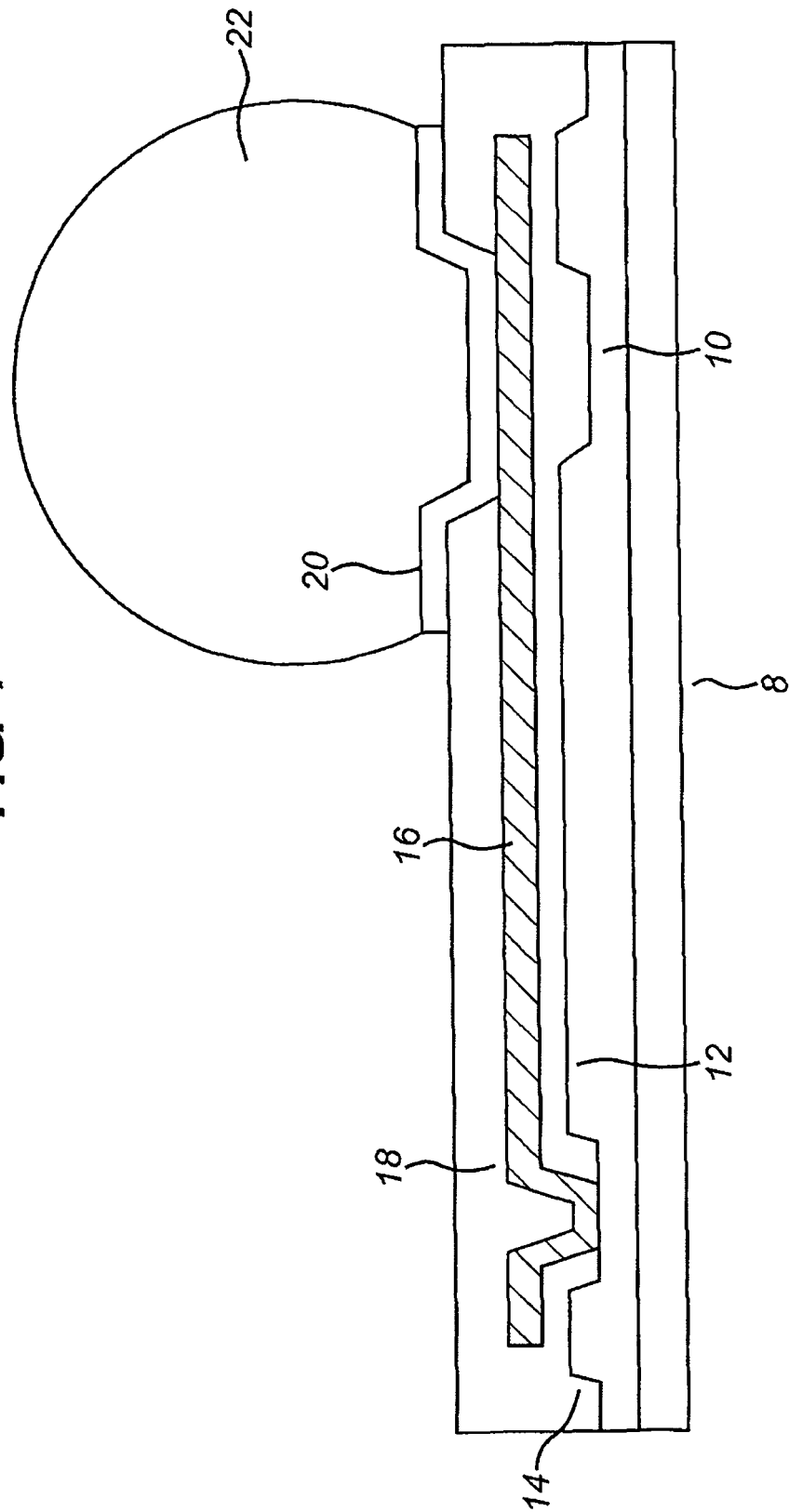

CHIP MOUNTING

The present invention relates to a technique for electrically connecting a printed circuit board to a chip defining one or more electronic devices.

One known technique of connecting a printed circuit board to a chip is known as wafer-level chip scale packaging (WLCSP), in which the "package" or interconnect elements are fabricated on the wafer prior to singulation. This technique is characterised in that: (a) there is no pre-assembly of the chip on a substrate before mounting onto the printed circuit board; and (b) the chip is ready for surface mounting on a printed circuit board as soon as it is singulated from the wafer. The area that the thus packaged chip occupies when mounted onto a printed circuit board is the size of the silicon die.

One such interconnection between a chip or integrated circuit 6 and a printed circuit board 2 is shown in FIG. 1, where the solder ball is designated by reference numeral 4. Also shown in FIG. 1 are the common locations 5 where cracks have been found to develop when the assembly is subject to impact testing, such as drop testing.

It is an aim of the present invention to provide a technique for improving the impact resistance of the electrical connections between the substrate and the solder elements when the chip is connected to a printed circuit board.

One aspect of the present invention provides a device comprising a chip including a substrate defining one or more electronic devices and a printed circuit board electrically connected to the chip via one or more solder elements sandwiched between the chip and the printed circuit board, wherein the chip is provided with one or more buffer layers between the substrate and the solder elements, said buffer layers having a Young's Modulus of 2.5 GPa or less.

Said one or more buffer layers may have a total thickness of more than 3 microns, more preferably—especially but not exclusively in the case of a single buffer layer—in the range of 4 to 8 microns. Said one or more buffer layers may have a total thickness of more than 10 microns, more preferably—especially but not exclusively in the case of multiple buffer layers—in the range of 13 to 20 microns.

The chip may be provided with two of said buffer layers. There may then be a patterned conductive layer such as a redistribution layer sandwiched therebetween for electrically connecting said one or more solder elements to said one or more electronic devices. In a preferred embodiment only one of those buffer layers is uninterrupted between the entirety of each solder element and the substrate. That may be the one of the layers that lies between the patterned conductive layer and the substrate. The other buffer layer may be interrupted under each solder element to allow the solder element to connect to the patterned conductive layer. Each of said two buffer layers may have a thickness of more than 5 microns, more preferably in the range of about 6.5 microns to about 10 microns, and most preferably of about 7.5 microns. The two buffer layers may have the same composition, or may be different. Preferably the two buffer layers each have a Young's Modulus of about 2 GPa.

The or each buffer layer may be located between each solder element and the substrate, preferably lying uninterruptedly between each solder element and the substrate. Such an uninterrupted buffer layer may conveniently be sandwiched between a patterned conductive layer such as a redistribution layer and the substrate. That buffer layer may have a thickness of more than 5 microns, more preferably in the range of about 6.5 microns to about 10 microns, and most preferably of about 7.5 microns. Preferably the buffer layer has a Young's Modulus of about 2 GPa.

The or each layer having a Young's modulus of about 2 GPa could have a Young's modulus of 1.6 to 2.4 GPa or from 1.7 to 2.3 GPa or from 1.8 to 2.2 GPa or from 1.9 to 2.1 GPa.

The device may comprise an array of said solder elements spaced at a pitch of 0.5 mm or less, or at a pitch of 0.4 mm or less. The one or more solder elements may be tin-based solder elements. They may have a composition including about 4% wt. silver, and about 0.5% wt. copper, although the invention is not limited to use with this composition and the advantages of the invention can be gained when other compositions are used. The solder elements may conveniently be solder balls or solder bumps.

The substrate may be a semiconductor wafer.

According to a second aspect of the present invention there is provided a chip including a substrate defining one or more electronic devices and one or more solder elements located within the area of the chip and electrically connected to said one or more electronic devices, wherein the chip is provided with one or more buffer layers having a Young's Modulus of 2.5 GPa or less between the substrate and the solder elements.

According to a third aspect of the present invention there is provided a device comprising a chip including a substrate defining one or more electronic devices and a printed circuit board electrically connected to the chip via one or more solder elements sandwiched between the chip and the printed circuit board, wherein the chip is provided with one or more buffer layers having a total thickness of more than 5 microns between the substrate and the solder elements.

According to a fourth aspect of the present invention there is provided a device comprising a chip including a substrate defining one or more electronic devices and one or more solder elements located within the area of the chip and electrically connected to said one or more electronic devices, wherein the chip is provided with one or more buffer layers having a total thickness of more than 5 microns between the substrate and the solder elements.

The total thickness of the buffer layer(s) may preferably be greater than 10 microns. The total thickness of the buffer layer(s) in the zone directly between the substrate and the parts of the solder elements that most closely approach the substrate may preferably be less than 10 microns, e.g. around 7 to 8 microns.

According to a fifth aspect of the present invention there is provided a wireless communication device including a device or a chip as set out above. That may be a handheld-portable device such as a mobile phone.

An embodiment of the invention is described in detail hereunder, by way of example only, with reference to the accompanying drawings, in which:

FIG. 4 illustrates a second WLCSP technique.

Figure 2:
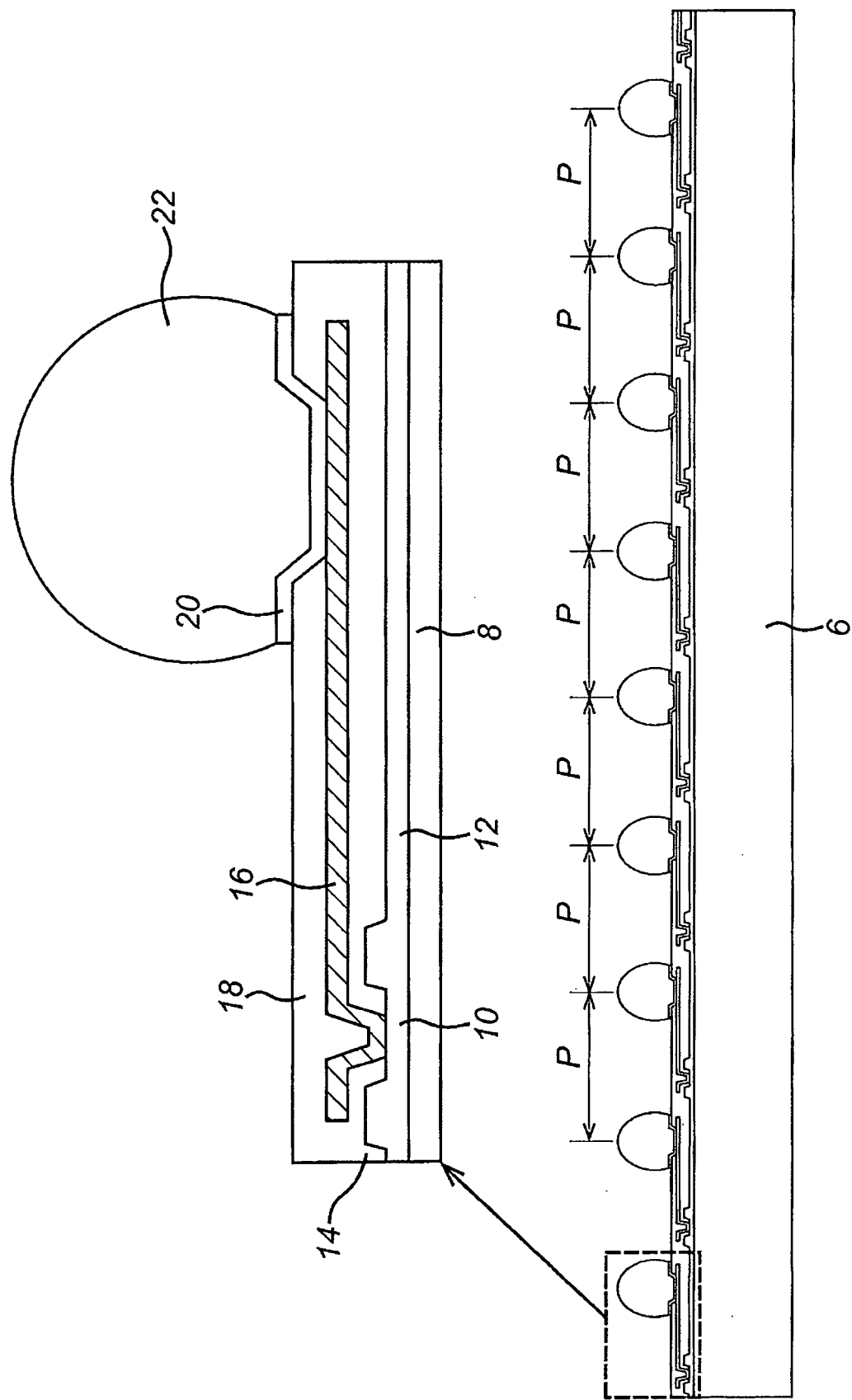
FIG. 2 illustrates a first WLCSP technique.

With reference to FIG. 2, a silicon wafer die 8 has a plurality of electronic devices defined therein. Aluminium pads 10 are then provided in contact with electrodes of the electronic devices. A passivation layer 12 is then provided over the entire area of the wafer die 8, and is then patterned to expose the aluminium pads 10. A first buffer layer 14 is then provided on the passivation layer 12 over the entire area of the wafer die 8, and is patterned to expose portions of the aluminium pads 10 exposed by the patterning of the passivation layer 12. A patterned conductive redistribution layer 16 is then provided on the first buffer layer 14 to provide lateral electrical connections between the locations of the aluminium pads 10 and the desired locations for the respective solder balls 22. Next, a second buffer layer 18 is then provided over the redistribution layer 16, and is patterned to expose portions of the redistribution layer at locations where it is desired to make contact to a solder ball 22. Under-bump metallisation (UBM) 20 is carried out on the thus exposed locations of the redistribution layer 16. Solder balls 22 are then provided in contact with the under-bump metallisations 20.

Figure 1:
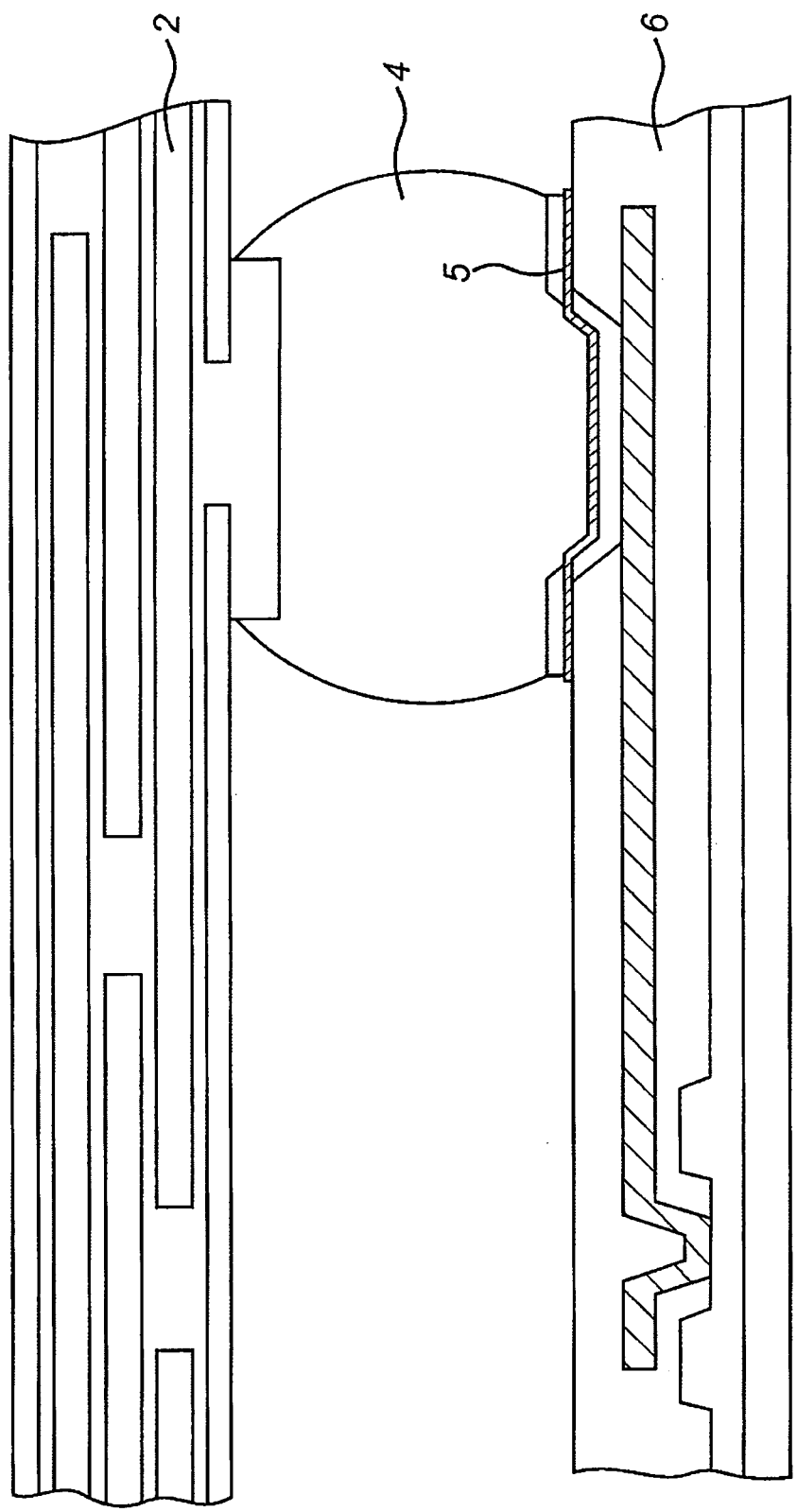
FIG. 1 illustrates a known technique of connecting a printed circuit board to a chip.

The thus processed/packaged wafer is then cut into chips and each chip is mounted onto a respective printed circuit board in the manner shown in FIG. 1 with the solder balls 22 providing the electrical connections between the chip and the printed circuit board.

In one embodiment of the present invention, the buffer layers 14, 18 have a Young's Modulus of 2.0 GPa and each have a thickness (t1 and t2) of 5 microns.

In a second embodiment of the present invention, the buffer layers 14, 18 also have the same Young's Modulus of 2.0 GPa and each have a thickness (t1 and t2) of 7.5 microns.

In the first and second embodiments, each of the buffer layers 14, 18 are provided by spin coating a polyimide precursor sold by HD Microsystems as HD-8820 at a spin speed of 1000-4000 rpm and a spin time between 30 and 60 seconds. This is followed by hot plate baking at 123° C. for 180 seconds. This is followed by selective exposure of those portions to be removed to reveal the aluminium pads (in the case of the first buffer layer 14) and the redistribution layer (in the case of the second buffer layer 18) at a fluence of 280-500 mj/cm$^2$, and development using 0.26N Tetra-Methyl Ammonium Hydroxide (TMAH) as a developer. The development step washes away the selectively irradiated portions of the buffer layer. Finally, each buffer layer is cured in a furnace in a nitrogen atmosphere at 320° C. The temperature of the furnace is ramped to 320° C. followed by a period of around 1 hour at 320° C. Changing the final cure temperature and/or the length of time at which the buffer layer is maintained at the final cure temperature can be used to adjust the Young's Modulus of the resultant film.

The thicknesses stated above are the thicknesses after curing.

The polyimide precursor mentioned above comprises 30-40% polyamide, 45-55% gamma-butyrolactone, 1-10% propylene glycol monomethyl ether acetate, 1 to 5% organo silan compound(s) and 1 to 10% photoinitiator.

Figure 3:
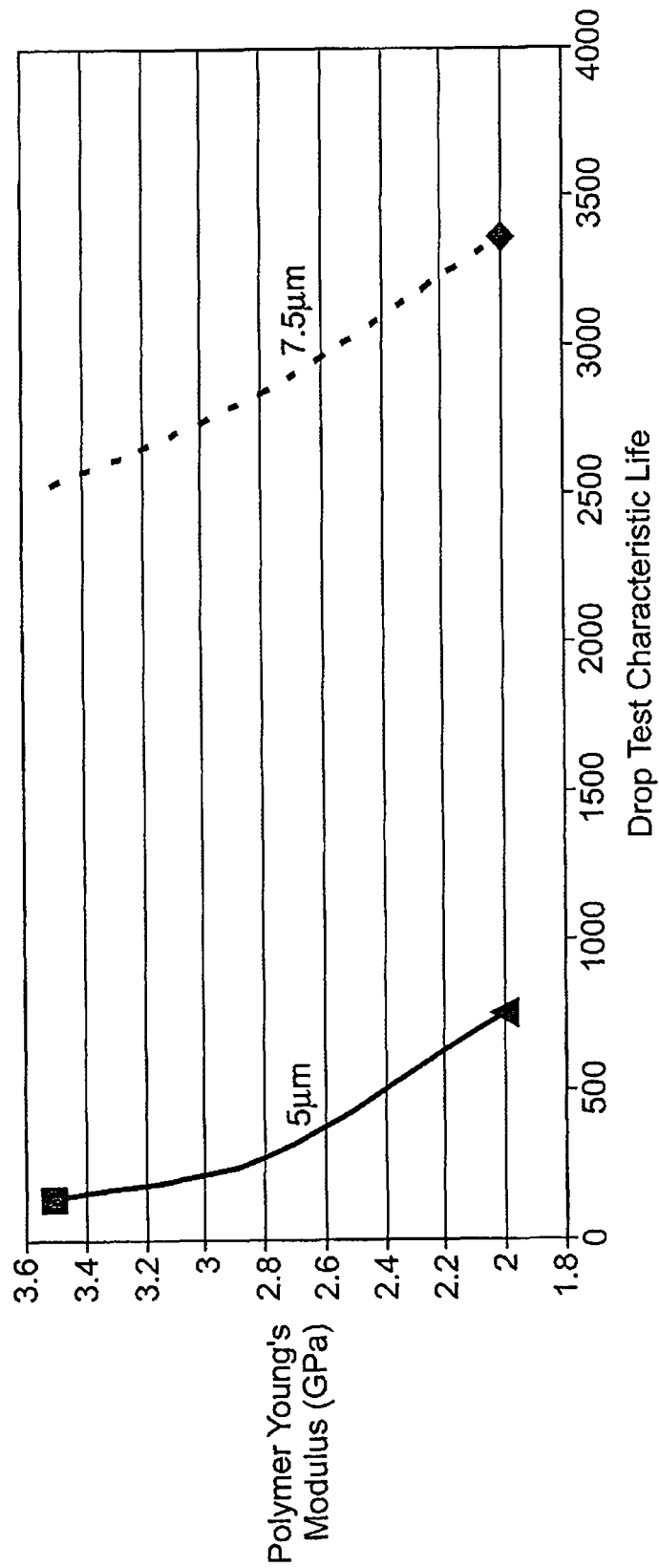
FIG. 3 illustrates the results of drop tests for embodiments of the present invention.

FIG. 3 illustrates the results of a drop test for the first (triangle marker) and second (diamond marker) embodiments. Comparison results of the same drop test for the same construction as the first embodiment but using buffer layers 14, 18 having a Young's Modulus of 3.5 GPa (square marker) are also shown. The line to 3.5 GPa and thickness of 7.5 microns is a modelled extrapolation. FIG. 3 shows how the drop test characteristic life is improved for the first embodiment compared to devices produced in an identical fashion except that the buffer layers 14, 18 have a Young's Modulus of 3.5 GPa. FIG. 3 also shows how the second embodiment exhibits yet improved drop test performance compared to the first embodiment.

In each of the above-described embodiments and the comparative devices, the solder balls were made from SAC405 (tin-based solder including 4% wt. silver and 0.5% wt. copper). It has been shown experimentally that this solder composition provides better results than other solder compositions in the first and second embodiments described above. However, other compositions may be used if desired.

Also, in each of the above-described embodiments and the comparative devices, the solder balls had a pitch P of 0.4 mm, but it is expected that the same improvements would be exhibited for different pitches, such as 0.5 mm and 0.3 mm.

Furthermore, temperature cycle tests have also been carried out for the first and second embodiments, and the temperature cycle performance of the first and second embodiments have also been found to be improved over at least some alternative technologies.

It will be noted that in the embodiment of FIG. 2 the buffer layer 14 is located directly between the solder ball 22 and the silicon wafer substrate 8. It is uninterrupted in the region where it underlies the solder ball 22. This physical arrangement of the components promotes the effectiveness of the buffer layer 14 in improving crack resistance. Such a physical arrangement can conveniently by achieved by using a redistribution layer as illustrated in FIG. 2 to allow a lateral offset between the solder pad 10 and the solder ball 22. When other connection techniques such as bump-on-l0 are being used it may be beneficial for the solder pad and the solder ball to be directly above one another. This can be achieved by using a second redistribution layer between the buffer layer 14 and the silicon wafer 8 to provide an electrical path that runs laterally from the pad. A via then passes through the polymer layer 14 at a point laterally offset from the pad to connect the second redistribution layer to a redistribution layer analogous to layer 16. The solder ball can then be formed over the pad, with the buffer layer 14 lying between the solder ball and the pad. Instead of a second redistribution layer, the pad itself could be laterally extended. This arrangement is illustrated in FIG. 4, in which analogous components are numbered as in FIG. 2.

The layer 18 could have a higher Young's modulus than layer 14. In some embodiments the layer 18 could be omitted or could not act as a buffer layer.

The embodiments described above make use of solder balls. Instead of balls, solder bumps or other forms of discrete solder elements can be used.

The buffer layer 14 could be homogeneous or could be formed of a stack of sub-layers. Any one or more of those layers could have Young's Modulus of 2.5 GPa or less.

Numerous variations of thickness and elastic modulus of layer 18 and/or layer 14 are possible. It has been found that a Young's modulus of around 2.0 GPa is especially advantageous for layer 14 because it provides beneficial results when the layer 14 has a thickness in the range from 5 to 10 microns, more preferably 7 to 8 microns. Outside that range it can become more difficult to form via holes through the layer 14 because the vias extend too far laterally or because it can be difficult to define a reliable contact through the via.

The invention is especially suitable for use with chips that are to be incorporated into mobile devices, particularly hand-held-portable devices such as mobile phones. Such devices are typically subject to considerable shocks and can particularly benefit from improved shock resistance. To this end the chip conveniently implements mobile communication functionality, such as a radio transmitter and/or receiver.

The applicant draws attention to the fact that the present invention may include any feature or combination of features disclosed herein either implicitly or explicitly or any generalisation thereof, without limitation to the scope of any definitions set out above. In view of the foregoing description it will be evident to a person skilled in the art that various modifications may be made within the scope of the invention.

The invention claimed is:

1. A chip including a substrate defining one or more electronic devices and one or more solder elements located within the area of the chip and electrically connected to said one or more electronic devices, wherein the chip is provided with two impact resisting buffer layers between the substrate and the solder elements and a patterned conductive layer sandwiched between the said buffer layers for electrically connecting said one or more solder elements to said one or more electronic devices, said buffer layers each having a Young's Modulus in the range of 1.6GPa to 2.4GPa, wherein the buffer layer between the substrate and the patterned conductive layer has a thickness in the range from 7 to 8 microns.

2. A chip according to claim 1, wherein said buffer layers have a total thickness of more than 10 microns.

3. A chip according to claim 2, wherein said buffer layers have a total thickness in the range of 13 to 20 microns.

4. A chip according to claim 2, wherein each of said two buffer layers has a thickness of more than 5 microns.

5. A chip according to claim 4, wherein the buffer layer between the patterned conductive layer and the one or more solder elements has a thickness in the range of about 6.5 microns to about 10 microns.

6. A chip according to claim 5, wherein each of said two buffer layers has a thickness of about 7.5 microns.

7. A device comprising a chip as claimed in claim 1 and a printed circuit board electrically connected to the chip via said one or more solder elements sandwiched between the chip and the printed circuit board.

8. A wireless communication device including a device according to claim 7.

9. A chip according to claim 1, wherein said two buffer layers have the same composition.

10. A chip according to claim 1, wherein the two buffer layers each have a Young's Modulus of about 2 GPa.

11. A chip according to claim 1, comprising an array of said solder elements spaced at a pitch of 0.5 mm or less.

12. A chip according to claim 1, comprising an array of said solder elements spaced at a pitch of 0.4 mm or less.

13. A chip according to claim 1, wherein the one or more solder elements are tin-based solder elements having a composition including about 4% wt. silver, and about 0.5%wt. copper.

14. A chip according to claim 1, wherein the solder elements are solder balls.

15. A chip according to claim 1, wherein the solder elements are solder bumps.

16. A chip according to claim 1, wherein the substrate is a semiconductor wafer.

17. A wireless communication device including a chip according to claim 1.

* * * * *